(12) United States Patent
Jang et al.

(10) Patent No.: US 6,468,914 B1
(45) Date of Patent: Oct. 22, 2002

(54) METHOD OF FORMING GATE ELECTRODE IN SEMICONDUCTOR DEVICE

(75) Inventors: Se Aug Jang; In Seok Yeo, both of Kyoungki-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/472,541

(22) Filed: Dec. 27, 1999

(30) Foreign Application Priority Data

Dec. 29, 1998 (KR) .......................................... 98-59944
Dec. 30, 1998 (KR) .......................................... 98-61862

(51) Int. Cl.$^7$ ..................... H01L 21/44; H01L 21/441; H01L 21/461
(52) U.S. Cl. ..................... 438/699; 438/745; 438/753; 438/754; 438/755
(58) Field of Search ................. 438/745, 754, 438/699, 753, 755

(56) References Cited

U.S. PATENT DOCUMENTS

| | | | |
|---|---|---|---|
| 4,404,732 A | 9/1983 | Andrade | 29/571 |
| 4,635,347 A | 1/1987 | Lien et al. | 29/591 |
| 4,740,826 A | 4/1988 | Chatterjee | 357/42 |
| 4,900,257 A | 2/1990 | Maeda | 437/200 |
| 4,929,567 A | 5/1990 | Park et al. | 437/41 |
| 5,071,788 A | 12/1991 | Joshi | 437/192 |
| 5,112,765 A | 5/1992 | Cederbaum et al. | 437/41 |
| 5,116,774 A | 5/1992 | Huang et al. | 437/40 |
| 5,160,407 A * | 11/1992 | Latchford et al. | 156/656 |
| 5,212,400 A | 5/1993 | Joshi | 257/412 |
| 5,409,853 A * | 4/1995 | Yu | 438/300 |
| 5,508,212 A | 4/1996 | Wang et al. | 437/24 |
| 5,559,047 A * | 9/1996 | Urabe | 438/401 |
| 5,599,725 A | 2/1997 | Dorleans et al. | 437/40 |
| 5,633,522 A | 5/1997 | Dorleans et al. | 257/344 |
| 5,668,394 A | 9/1997 | Lur et al. | 257/413 |
| 5,677,217 A | 10/1997 | Tseng | 437/45 |
| 5,688,706 A | 11/1997 | Tseng | 437/45 |
| 5,739,064 A * | 4/1998 | Hu et al. | 438/528 |
| 5,744,395 A | 4/1998 | Shue et al. | 438/305 |
| 5,747,373 A | 5/1998 | Yu | 438/305 |
| 5,789,312 A | 8/1998 | Buchanan et al. | 438/585 |
| 5,811,354 A | 9/1998 | Yzng | 438/682 |
| 5,858,831 A | 1/1999 | Sung | 438/241 |
| 5,858,867 A | 1/1999 | Hsia et al. | 438/592 |
| 5,879,986 A | 3/1999 | Sung | 438/253 |
| 6,245,620 B1 * | 6/2001 | Jang et al. | 438/303 |
| 6,255,173 B1 * | 7/2001 | Jang | 438/279 |

FOREIGN PATENT DOCUMENTS

| | | | |
|---|---|---|---|
| JP | 55030867 | 3/1980 | H01L/29/78 |
| JP | 60015920 | 1/1985 | H01L/21/30 |
| JP | 61230362 | 10/1986 | H01L/27/10 |
| JP | 61241974 | 10/1986 | H01L/29/78 |
| JP | 362222654 A * | 9/1987 | H01L/21/88 |
| JP | 01125985 | 5/1989 | H01L/29/80 |
| JP | 01175257 | 7/1989 | H01L/29/78 |

(List continued on next page.)

OTHER PUBLICATIONS

Takagi et al., Manufacture of Semiconductor Device, Sep. 30, 1987, (English Abstract of JP 362222654 A), 1 page.*
Ishikawa, Semiconductor Device, and Its Manufacture, Dec. 6, 1996, (English Abstract of JP 408162522 A), 1 page.*

*Primary Examiner*—Benjamin L. Utech
*Assistant Examiner*—Lynette T. Umez-Eronini
(74) *Attorney, Agent, or Firm*—Finnegan, Henderson, Farabow, Garrett & Dunner, L.L.P.

(57) ABSTRACT

A method of forming a gate electrode in a semiconductor device which can prevent abnormal oxidation of a titanium silicide layer when performing gate re-oxidation process after a gate electrode having a stacked structure of a doped polysilicon layer and the titanium silicide layer.

32 Claims, 10 Drawing Sheets

FOREIGN PATENT DOCUMENTS

| | | | | |
|---|---|---|---|---|
| JP | 01187871 | 7/1989 | ........... | H01L/29/78 |
| JP | 01207971 | 8/1989 | ........... | H01L/29/78 |
| JP | 01207972 | 8/1989 | ........... | H01L/29/78 |
| JP | 01207973 | 8/1989 | ........... | H01L/29/78 |
| JP | 01251758 | 10/1989 | ........... | H01L/29/78 |
| JP | 02007552 | 1/1990 | ........... | H01L/27/04 |
| JP | 02026074 | 1/1990 | ......... | H01L/29/784 |
| JP | 02077162 | 3/1990 | ......... | H01L/29/784 |
| JP | 02129917 | 5/1990 | ......... | H01L/21/302 |
| JP | 04336468 | 11/1992 | ......... | H01L/29/784 |
| JP | 07263680 | 10/1995 | ........... | H01L/29/78 |
| JP | 408162522 A * | 6/1996 | ........... | H01L/21/76 |
| JP | 10135452 | 5/1998 | ........... | H01L/29/78 |

* cited by examiner

METHOD OF FORMING GATE ELECTRODE IN SEMICONDUCTOR DEVICE

BACKGROUND OF THE INVENTION

1. Field of the Invention

The present invention relates to a method of forming a gate electrode in a semiconductor device, and more particularly to a method of forming a gate electrode having a stacked structure of a polysilicon layer and a titanium silicide layer.

2. Description of the Related Art

In general, a MOS transistor is selected by a selection signal applied to a gate electrode. Here, the gate electrode is mostly formed of a doped polysilicon layer or a stacked structure of the doped polysilicon and a tungsten silicide ($WSi_2$) layer. While the above doped polysilicon layer and stacked layer are easily applied to a low integration semiconductor device, it is difficult that they are applied to a high integration semiconductor device because of not obtaining low gate resistivity.

Therefore, a method of forming a gate electrode by depositing a titanium silicide($TiSi_2$) layer having a good conductivity on a polysilicon layer, is suggested. Here, the titanium silicide layer is formed by two methods as follows.

A first method deposits a titanium(Ti) layer on a polysilicon layer and performs annealing, to react the Ti with Si of the polysilicon layer, thereby forming a titanium silicide ($TiSi_2$) layer. A second method deposits a $TiSi_x$ layer of an amorphous phase on a polysilicon layer by physical vapor deposition(PVD) using a $TiSi_x$ target and performs annealing, thereby forming a $TiSi_2$ layer of a crystalline phase.

FIG. 1A to FIG. 1E are cross sectional views describing a method of forming a gate electrode in a semiconductor device using the second method according to the prior art.

Referring to FIG. 1A, a gate oxide layer 2 is formed on a semiconductor substrate 1 by thermal growth or deposition and a doped polysilicon layer 3 is formed thereon to a selected thickness. Thereafter, a titanium silicide($TiSi_x$) layer 4 of an amorphous phase is deposited on the polysilicon layer 3 by PVD, as shown in FIG. 1B.

Referring to FIG. 1C, the resultant substrate is thermal-treated at a selected temperature for several seconds by rapid thermal process, so that the titanium silicide layer 4 of an amorphous phase is transformed into a titanium silicide ($TiSi_2$) layer 5 of a crystalline phase.

Referring to FIG. 1D, a sacrificial layer 6 is formed on the titanium silicide layer 5. Preferably, the sacrificial layer 6 is formed of an oxide layer or a nitride layer. The sacrificial layer 6, the titanium silicide layer 5, the polysilicon layer 3 and the gate oxide layer, 2 are etched to form a gate electrode.

Referring to FIG. 1E, for removing damage and residues due to the etching and recovering the reliability of the gate oxide layer 2, the resultant substrate 1 where the gate electrode is formed is oxidized by re-oxidation process. The re-oxidation process is performed at a selected temperature, for example 800° C. or more by thermal oxidation, so that an oxide layer 7 is formed on the surface of the substrate 1 and on the side walls of the gate oxide layer 2, the polysilicon layer 3 and the titanium silicide layer 5. As not shown in the drawings, the oxide layer 7 is then removed selectively, to remove the damage and residues due to the etching and recover the gate oxide layer 2.

However, when performing the re-oxidation process, owing to the difference in oxidation rate between the polysilicon layer 2 and the titanium silicide layer 5, the thickness of an oxide layer 7 in the side walls of the polysilicon layer 3 differs from that of the titanium silicide layer 5. Namely, since the titanium silicide layer 5 is faster in oxidation rate than the polysilicon layer 3, the titanium silicide layer 5 is excessively oxidized during the re-oxidation process.

Therefore, the line width of the titanium silicide layer determining the conductivity of the gate electrode is extremely reduced, thereby deteriorating the conductivity of the gate electrode.

In general, when forming the above gate electrode having a stacked structure of the polysilicon layer and the $TiSi_2$ layer, following factors are considered.

FIG. 2 is a graph showing particle number to mole ratio of Si:Ti in a $TiSi_x$ target during sputtering a $TiSi_x$ layer by PVD.

In FIG. 2, a dot line A shows particle number due to excess silicon when the mole ratio of Si:Ti is high, a dot line B shows particle number due to vacancy occurred by deficient silicon when the mole ratio of Si:Ti is low, and line C shows substantial particle number to the mole ratio of Si:Ti.

Here, the $TiSi_x$ target has various mole ratio x of Si:Ti. The mole ratio of Si:Ti is generally 1.8 to 2.5. Furthermore, in case using $TiSi_x$ target the mole ratio x of Si:Ti of which is 2.05 to 2.10, particle number is minimum, as shown in FIG. 2.

Accordingly, in case using $TiSi_x$ target having excessive silicon, it is founded that an oxide layer is uniformly formed on the side walls of a polysilicon layer and a titanium silicide layer during gate re-oxidation process.

SUMMARY OF THE INVENTION

It is therefore an object of the present invention to provide a method of forming a gate electrode in a semiconductor device which can prevent abnormal oxidation of a titanium silicide layer when performing gate re-oxidation process after forming a gate electrode having a stacked structure of a doped polysilicon layer and the titanium silicide layer.

To accomplish this above object, according to the present invention, a silicon layer is formed on the side wall of a metal silicide layer or between the metal silicide layers, so that the silicon layer is oxidized instead of the metal silicide during gate re-oxidation. Here, the metal is one selected from the group of titanium, molybdenum and tungsten.

One method of forming a gate electrode in a semiconductor device according to the present invention, includes the steps of: forming a gate oxide layer, a polysilicon layer, a refractory conductive layer and a mask layer on a semiconductor substrate, in sequence; etching the mask layer, the refractory conductive layer, the polysilicon layer and the gate oxide layer to form a gate electrode; forming a silicon layer on the surface of the substrate and the gate electrode; anisotropically etching the silicon layer so as to exist on the side wall of the gate electrode; and oxidizing the resultant substrate by re-oxidation process.

Here, when a titanium silicide layer is used as the refractory conductive layer, the step of removing the side wall of the titanium silicide layer to a selected width is performed between the step of forming the gate electrode and the step of forming the silicon layer. Preferably, the titanium silicide layer is removed by performing wet etching using dilute HF solution or dilute BOE solution. The side walls of the titanium silicide layer is removed to the thickness of 20 to 100 Å. Furthermore, the titanium silicide layer is formed by physical vapor deposition using a titanium silicide target the mole ratio of Si:Ti of which is 2.0 to 2.5.

Moreover, for crystallizing the titanium silicide layer, the step of performing thermal-treating the titanium silicide layer is performed after the step of forming the titanium silicide layer. Preferably, the thermal-treating is performed at the temperature of 700 to 900° C. for 10 to 60 seconds. Furthermore, the gate oxide layer is formed to the thickness of 30 Å or more.

According to the present invention, re-oxidation process is performed after forming a silicon layer on the side wall of a gate electrode having a stacked structure of a polysilicon layer and a titanium silicide layer, so that the only the silicon layer is oxidized. Therefore, abnormal oxidation of the titanium silicide layer is prevented during the re-oxidation process, so that the line width of the titanium silicide layer is maintained, thereby improving the conductivity of the gate electrode.

Another method of forming a gate electrode in a semiconductor device includes the steps of: forming a gate oxide layer and a polysilicon layer on a semiconductor substrate; depositing a first $TiSi_x$ layer on the polysilicon layer; depositing a silicon layer on the $TiSi_x$ layer; depositing a second $TiSi_x$ layer on the silicon layer; thermal-treating the resultant substrate to form a crystalline $TiSi_2$ layer on the polysilicon layer; depositing an insulating layer on the $TiSi_2$ layer; etching the insulating layer, the $TiSi_2$ layer, the polysilicon layer and the gate oxide layer to form a gate electrode having a stacked of $TiSi_2$ layer and the polysilicon layer; and performing gate re-oxidation for removing damage and particle due to the etching and recovering the reliability of the gate oxide layer.

Here, the first and second $TiSi_x$ layers are respectively formed by physical vapor deposition using $TiSi_x$ target the mole ratio of Si:Ti of which is 2.0 to 2.2.

According to the present invention, by using $TiSi_x$ target the mole ratio of Si:Ti of which is 2.0 to 2.2 and by interposing a silicon layer between first and second $TiSi_x$ layers, the $TiSi_x$ layer is formed in silicon rich state, thereby being capable of forming a gate electrode with a stacked structure of $TiSi_2$ layer/polysilicon layer having good properties.

DETAILED DESCRIPTION OF THE INVENTION

Hereinafter, preferred embodiments of the present invention will be explained with reference to accompanying drawings.

Firstly, a method of forming a gate electrode in a semiconductor device according to a first embodiment of the present invention will be explained with reference to FIG. 3A to FIG. 3G.

Figure 1A:
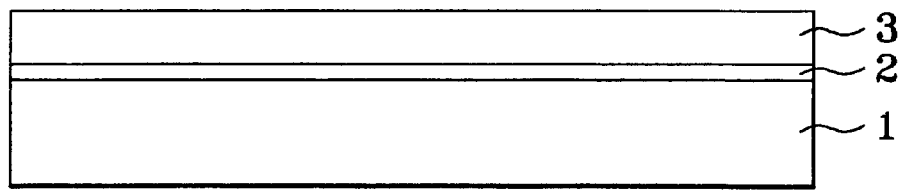
FIG. 1A to FIG. 1E are cross sectional views describing a method of forming a gate electrode in a semiconductor device according to the prior art.
Figure 1B:
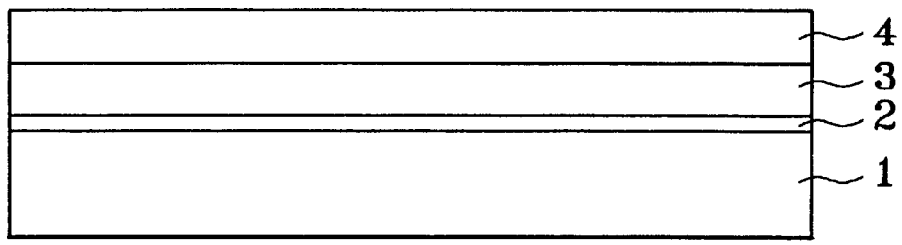
Figure 1C:
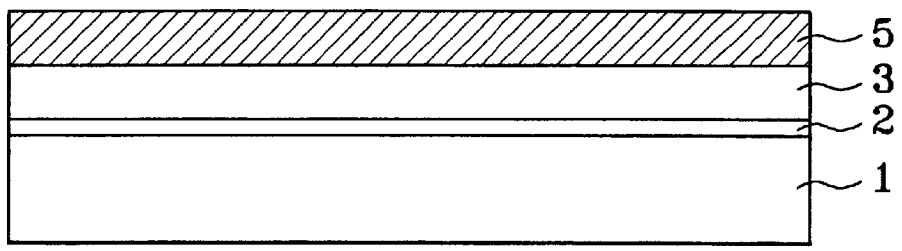
Figure 1D:
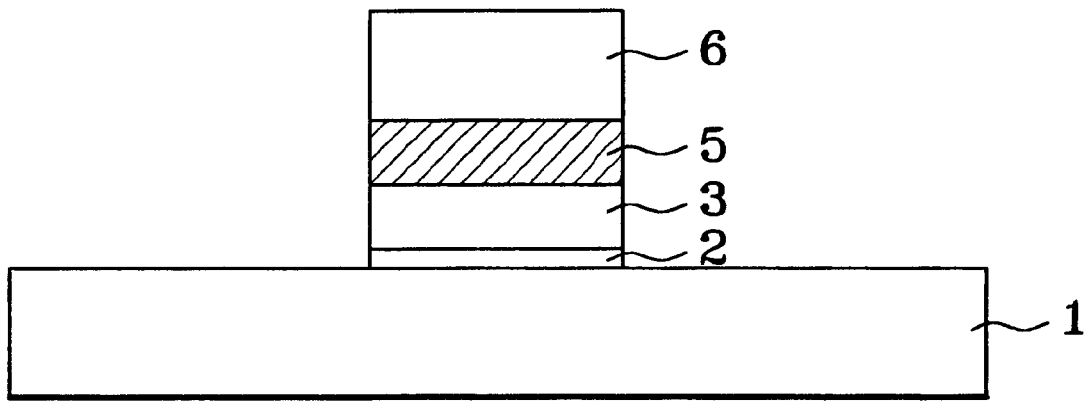
Figure 1E:
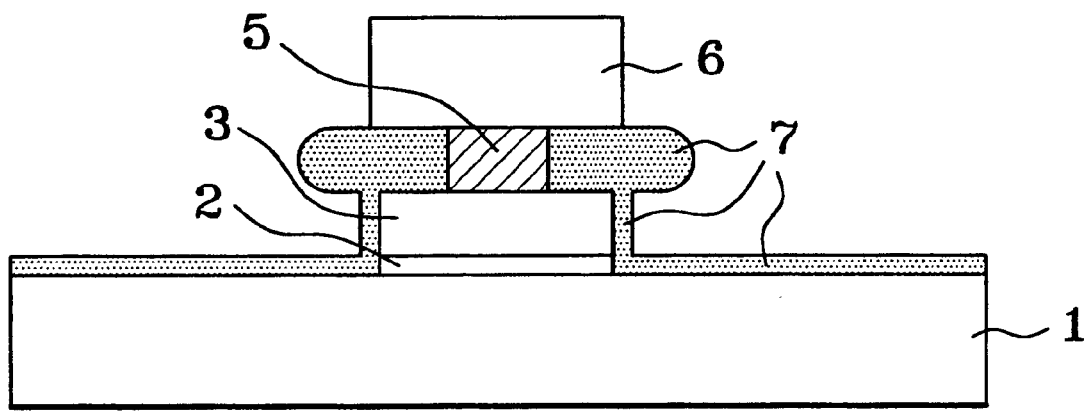
Figure 2:
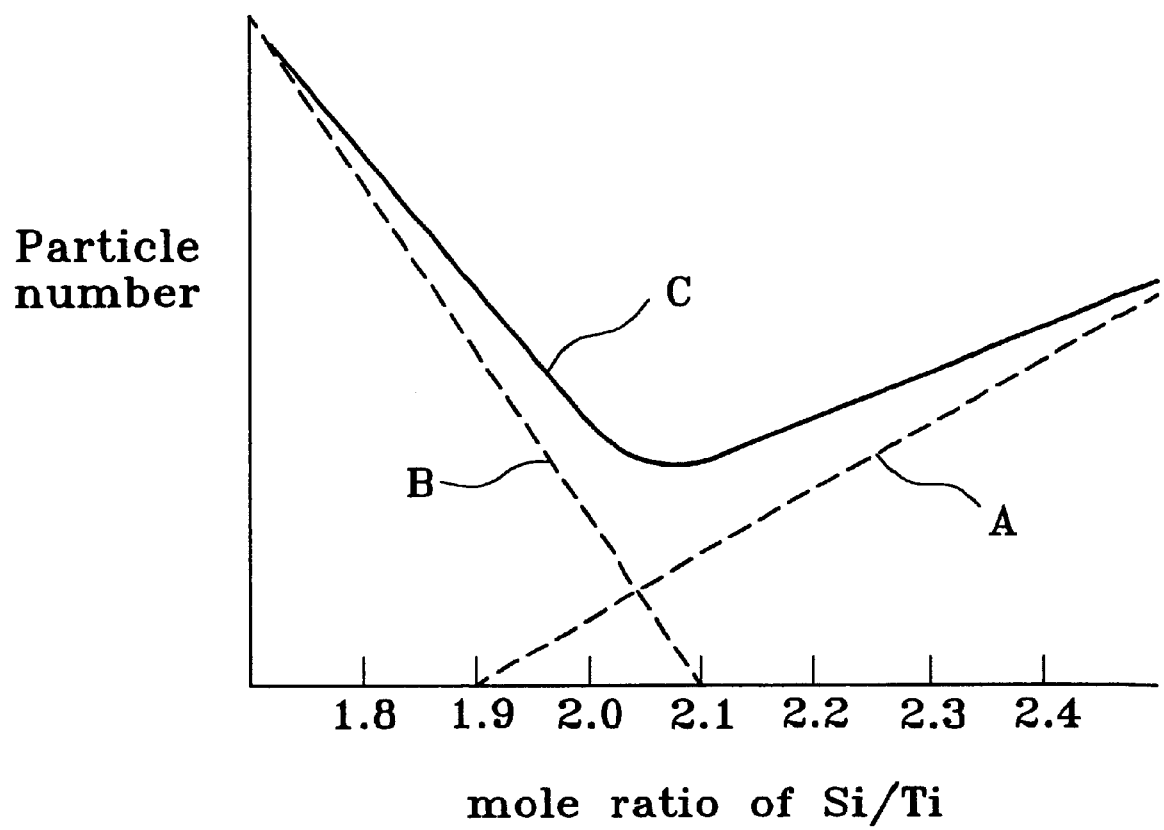
FIG. 2 is a graph showing particle number to mole ratio of Si:Ti.
Figure 3A:
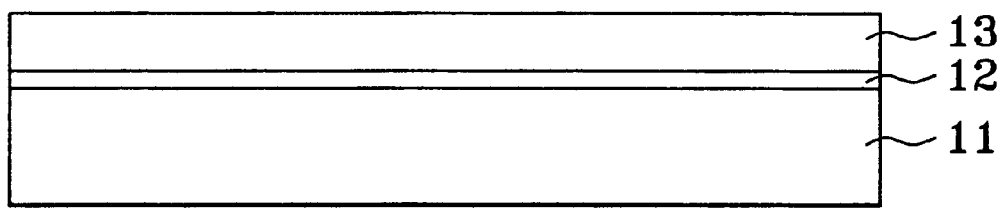
FIG. 3A to FIG. 3G are cross sectional views describing a method of forming a gate electrode in a semiconductor device according to a first embodiment of the present invention.

Referring to FIG. 3A, a gate oxide layer 12 is formed on a semiconductor substrate 11 by thermal growth or deposition. A polysilicon layer having a low resistivity, preferably a doped polysilicon layer 13 is then formed on the gate oxide layer 12 to a selected thickness. Here, the gate oxide layer 12 is formed to the thickness of about 30 Å or more, preferably 30 to 100 Å in view of being removed during subsequent wet etching process. Furthermore, the polysilicon layer 13 is formed by low pressure chemical vapor deposition(LPCVD).

Figure 3B:
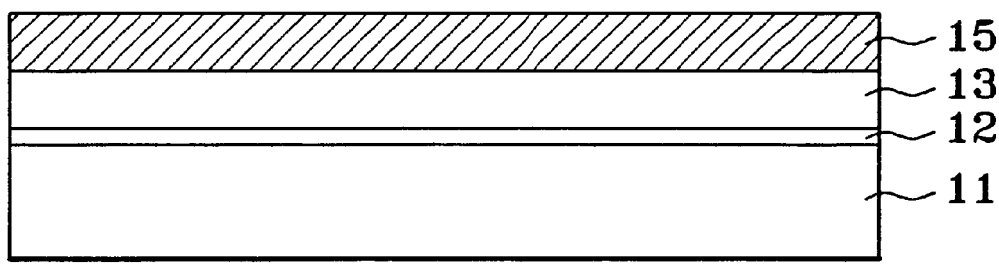

Referring to FIG. 3B, a titanium silicide($TiSi_x$) layer of an amorphous phase is deposited on the polysilicon layer 13 by physical vapor deposition(PVD) using a titanium silicide target. Here, the mole ratio of Si/Ti in the titanium silicide target is 2.0 to 2.5. Furthermore, the titanium silicide layer is formed to the thickness of 500 to 1,000 Å. The thermal-treating is performed at a selected temperature, preferably 700 to 900° C. for 10 to 60 seconds, to transform the titanium silicide layer of the amorphous phase into a titanium silicide($TiSi_2$) layer 15 of a crystalline phase.

Figure 3C:
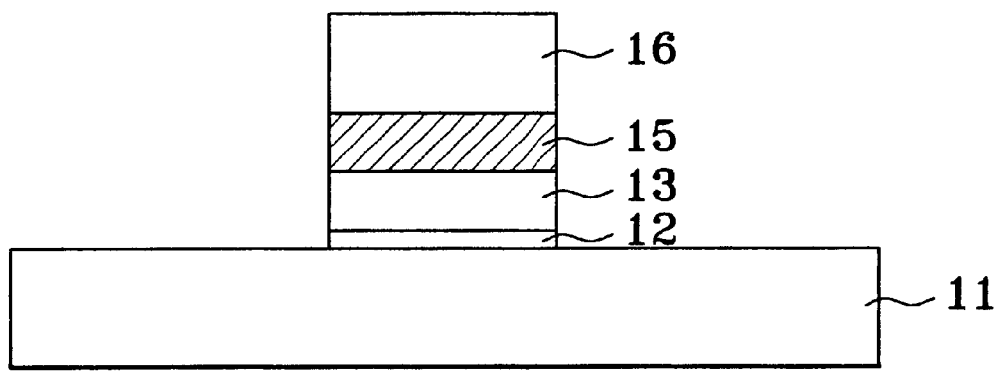

Referring to FIG. 3C, a mask layer 16 is formed on the titanium silicide layer 15 to a selected thickness. The mask layer 16 is formed of an oxide layer or a nitride layer. A resist pattern(not shown) is then formed in the shape of a gate electrode on the mask layer 16 by photolithography. Next, the mask layer 16 is patterned using the resist pattern as a mask. Thereafter, the titanium silicide layer 15, the polysilicon layer 13 and the gate oxide layer 12 are patterned using the patterned mask layer 16 as a mask to form a gate electrode.

Figure 3D:
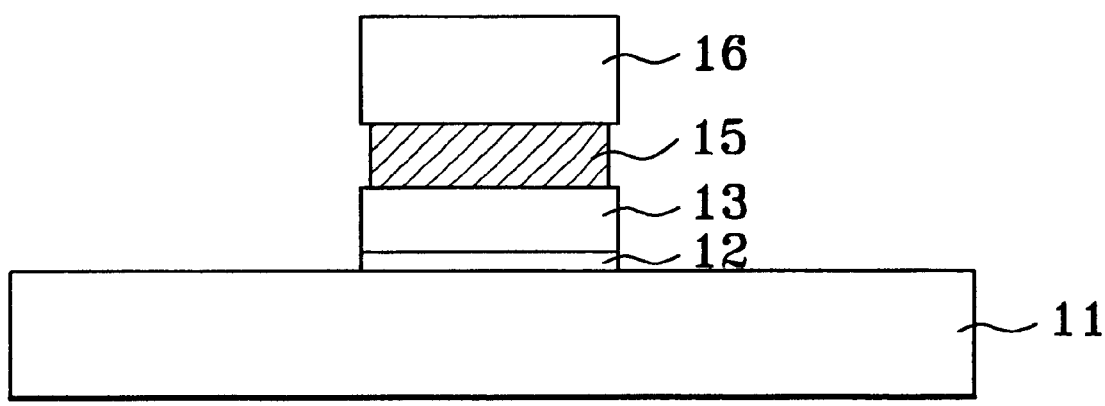

Referring to FIG. 3D, the resultant substrate is etched by wet etching using dilute HF solution or dilute buffered oxide etchant(BOE). At this time, since the titanium silicide layer 15 is faster in etch rate than the gate oxide layer 12, the only portion of the side wall of the titanium silicide layer 15 is removed. Preferably, the wet etching is performed so that the side wall of the titanium silicide layer 15 is removed to the thickness of 20 to 100 Å.

On the other hand, the wet etching process may be omitted, since it is performed to prevent the oxidation of the titanium silicide layer more effectively during gate re-oxidation process.

Figure 3E:
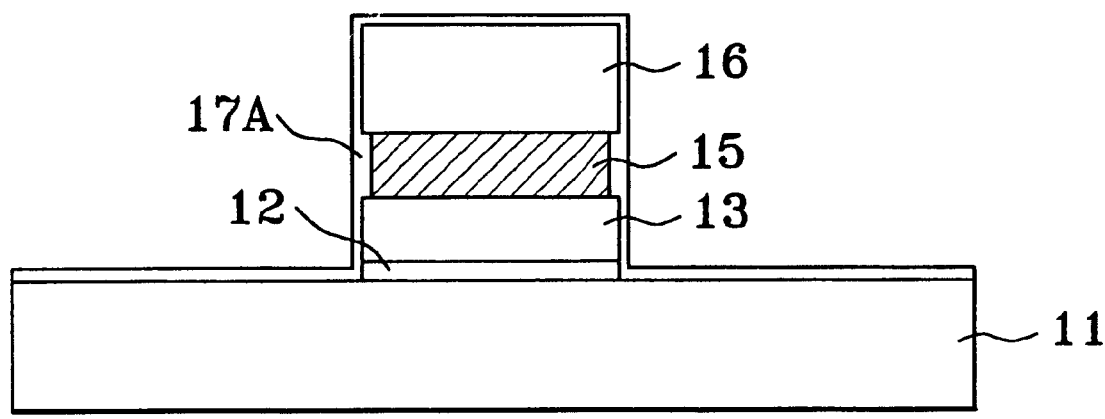

Referring to FIG. 3E, a silicon layer 17 is formed on the structure of FIG. 3D. The silicon layer 17 is formed to the thickness of 100 Å or less, preferably, 10 to 100 Å, enough to fill the etched portion of the side wall of the titanium silicide layer 15. Here, it is preferable that the silicon layer 17 is formed of an undoped silicon layer having relatively slow oxidation rate than a doped silicon layer. Moreover, it is more preferable that the silicon layer 17 is formed of an amorphous silicon layer capable of forming easily thin film than a polysilicon layer.

Figure 3F:
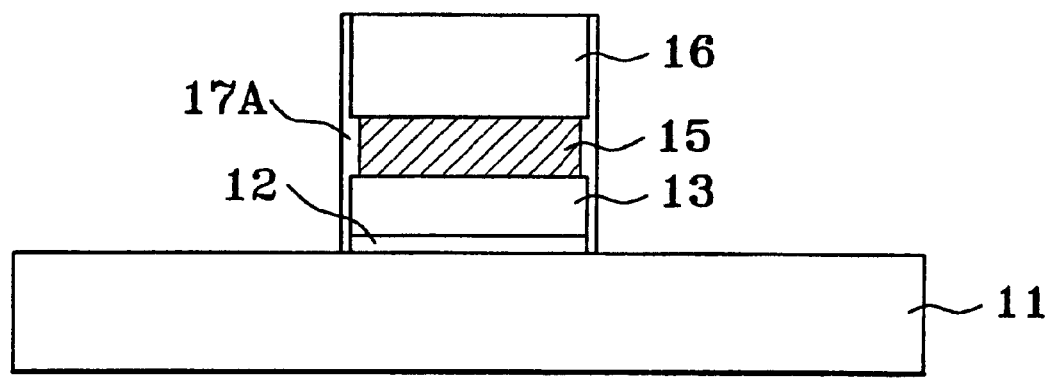

Referring to FIG. 3F, the silicon layer 17 is anisotropically etched to remain on the side wall of the gate electrode. In FIG. 3F, a reference number 17A shows the silicon layer remained on the side wall.

Figure 3G:
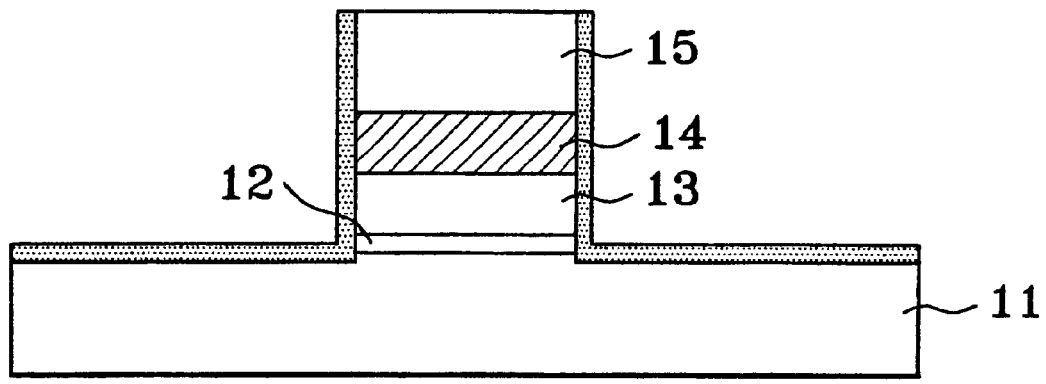

Referring to FIG. 3G, for removing damages and polysilicon residues due to the etching and recovering the reliability of the gate oxide layer by occurring bird's beak of the gate oxide layer, the resultant substrate is oxidized by re-oxidation process. Preferably, the re-oxidation process is performed at the temperature of 700 to 850° C. under dry atmosphere so that an oxide layer is formed to the thickness of 20 to 200 Å. At this time, the side wall of the titanium silicide layer 15 is not oxidized, since it is capped by the silicon layer 17. Furthermore, owing to the silicon layer 17, the oxide layer is uniformly formed on the side wall of the gate electrode and on the surface of the substrate as shown in FIG. 3G. As a result, abnormal oxidation of the titanium silicide layer 14 is prevented.

Secondly, a method of forming a gate electrode in a semiconductor device according to a second embodiment of the present invention will be explained with reference to FIG. 4A to FIG. 4E.

Figure 4A:
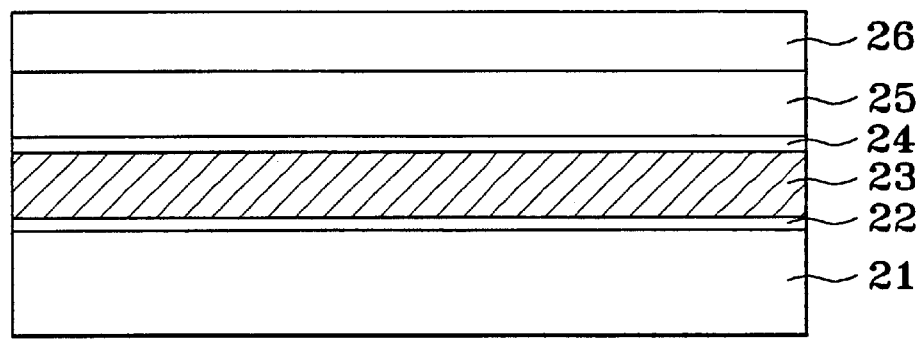
FIG. 4A to FIG. 4E are cross sectional views describing a method of forming a gate electrode in a semiconductor device according to a second embodiment of the present invention.

Referring to FIG. 4A, a gate oxide layer 22 is formed on a semiconductor substrate 21 by surface thermal oxidation. A doped polysilicon layer 23, a diffusion barrier layer 24, a refractory metal thin film 25 and a mask layer 26 are then formed on the gate oxide layer 22, in sequence. The diffusion barrier layer 24 is formed to the thickness of 50 to 300 Å using a tungsten nitride(WN) layer or a titanium nitride (TiN) layer. The refractory metal thin film 25 is formed to the thickness of 500 to 2,000 Å using one selected from the group consisting of a tungsten(W) layer, a tantalum(Ta) layer and a molybdenum(Mo) layer. The mask layer 26 is formed by chemical vapor deposition(CVD). Here, the mask layer 26 is used as an etch mask during subsequent etching process for forming a gate electrode.

Figure 4B:
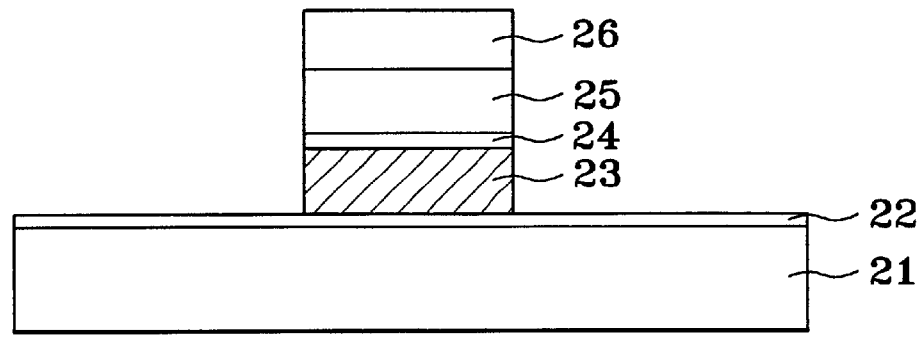

Referring to FIG. 4B, a resist pattern(not shown) is formed on the mask layer 26 by photolithography and the mask layer 26 is patterned using the resist pattern as a mask. Next, the refractory metal thin film 25, the diffusion barrier layer 24 and the doped polysilicon layer 23 are patterned by dry etching using the patterned mask layer 26 as a mask, so that a gate electrode is formed.

Figure 4C:
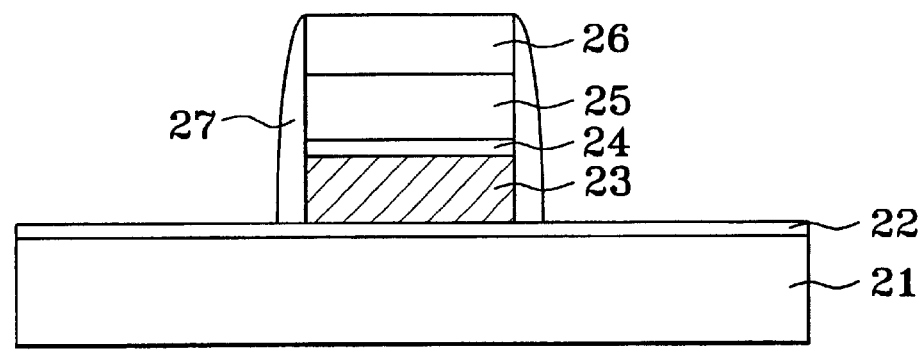

Referring to FIG. 4C, a silicon layer is formed on the structure of FIG. 4B to the thickness of 50 to 200 Å. Thereafter, the silicon layer is anisotropically etched to form a silicon spacer 27 on the side wall of the gate electrode.

Figure 4D:
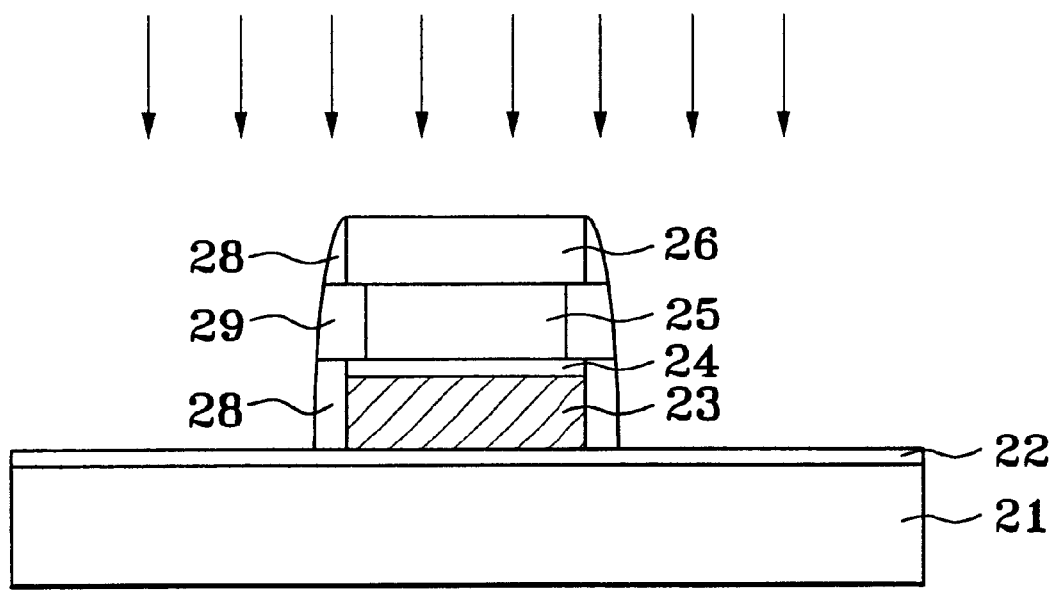

Referring to FIG. 4D, the resultant substrate is thermal-treated at a selected temperature. Therefore, the silicon spacer 17 existing on the side walls of the mask layer 26, the diffusion barrier layer 24 and the doped polysilicon layer 23 is oxidized to form a thermal oxidation 28. Furthermore, silicon of the silicon spacer 17 is reacted with refractory metal of the refractory metal thin film 25 to form a silicide layer 29 wherein the silicide layer 29 is larger in the line width than that of the silicon spacer 27. Therefore, the refractory metal thin film 25 is capped with the silicide layer 29. Thereafter, low concentration impurity ions are ion-implanted into the exposed substrate 21.

Figure 4E:
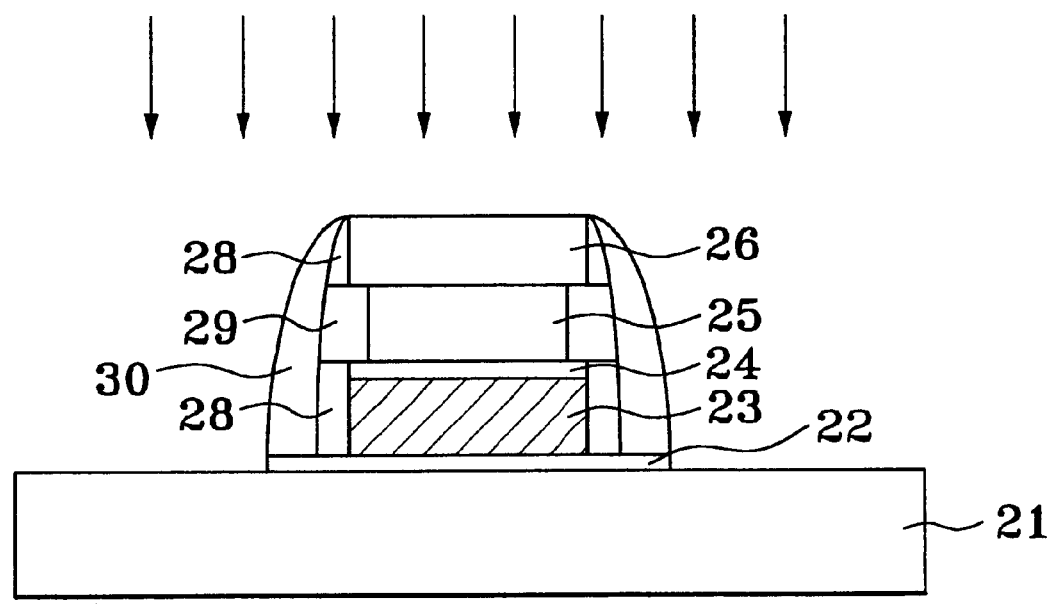

Referring to FIG. 4E, an oxide layer is formed on the structure of FIG. 4D to a selected thickness and etched anisotropically to form a oxide spacer, for forming source/drain with lightly doped drain(LDD) structure. Furthermore, it is preferable to define the line width of the oxide spacer 30 in view of the line widths of the thermal oxidation layer 18 and the silicide layer 29. Thereafter, high concentration impurity ions are ion-implanted using the oxide spacer 30 as a mask.

Thirdly, a method of forming a gate electrode in a semiconductor device according to a third embodiment of the present invention will be explained with reference to FIG. 5A to FIG. 5D.

Figure 5A:
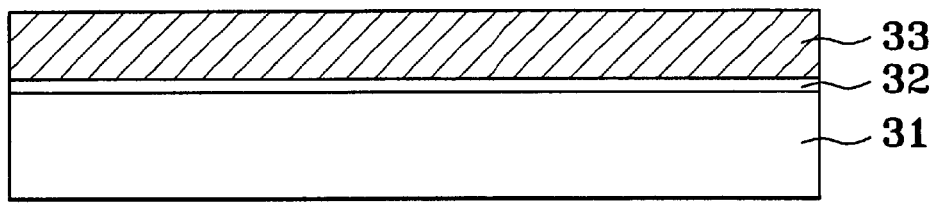
FIG. 5A to FIG. 5E are cross sectional views describing a method of forming a gate electrode in a semiconductor device according to a third embodiment of the present invention.

Referring to FIG. 5A, a gate oxide layer 32 is formed on a semiconductor substrate 31 by thermal oxidation. A polysilicon layer 33 having a low resistivity is formed on the gate oxide layer 32 by LPCVD.

Figure 5B:
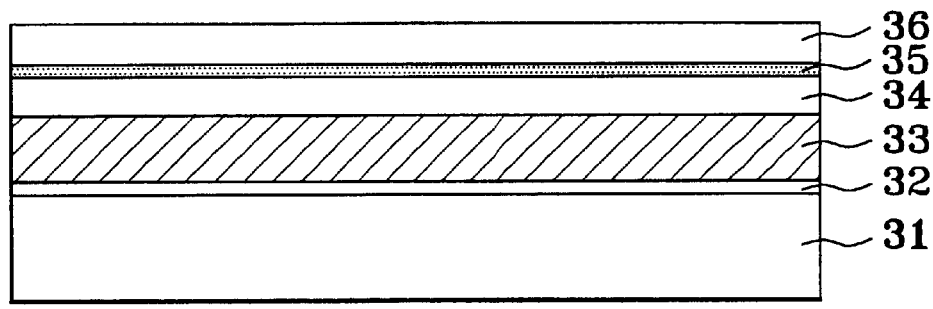

Referring to FIG. 5B, a first $TiSi_x$ layer 34 is formed on the polysilicon layer 33 by PVD using a $TiSi_x$ target the mole ratio of Si:Ti of which is 2.0 to 2.2, for minimizing particle. Preferably, the first $TiSi_x$ layer 34 is formed to the thickness of 300 to 800 Å. Next, a silicon layer 35 is formed on the first $TiSi_x$ layer 34 to the thickness of 50 to 300 Å. A second $TiSi_x$ layer 36 is then formed on the silicon layer 35 by PVD using a $TiSi_x$ target of which is 2.0 to 2.2. Preferably, the second $TiSi_x$ layer 36 is formed to the thickness of 300 to 800 Å.

Here, each phase of the first and second $TiSi_x$ layers 34 and 36 is amorphous. Furthermore, the silicon layer 35 is formed of one selected from the group consisting of an amorphous silicon layer, a polysilicon layer, an undoped silicon layer and doped silicon layer.

Figure 5C:
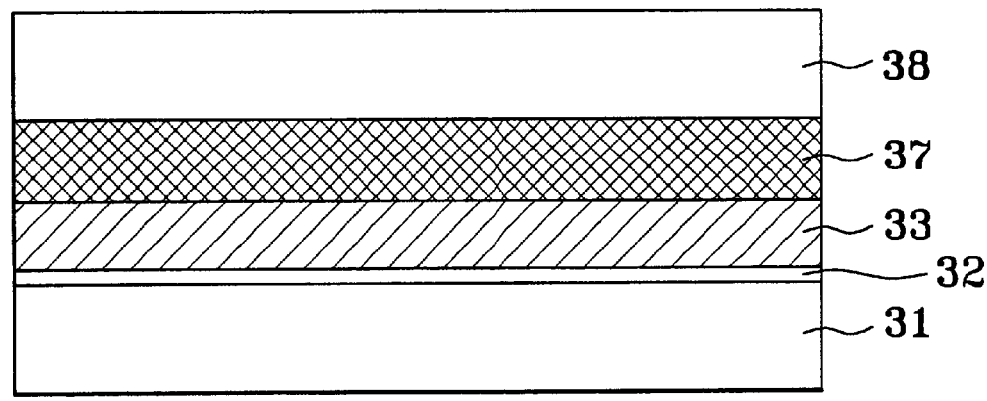

Referring to FIG. 5C, thermal-treating is performed to transform the first and second $TiSi_x$ layers of the amorphous phase into a $TiSi_2$ layer 37 of a crystalline phase. At this time, the $TiSi_2$ layer 37 is formed in the silicon rich state, since solid reaction is performed between the first and second $TiSi_x$ layer 34 and 36 and the silicon layer 35 so that excess silicon remains in the $TiSi_2$ layer 37. Preferably, the thermal-treating is performed by furnace process, rapid thermal process or thermal process combining the furnace and the rapid thermal processes. For example, the furnace process is performed at the temperature 700 to 900° C. for 5 to 30 minutes. Furthermore, the rapid thermal process is performed at the temperature 700 to 1,000° C. for 10 to 60 seconds.

Figure 5D:
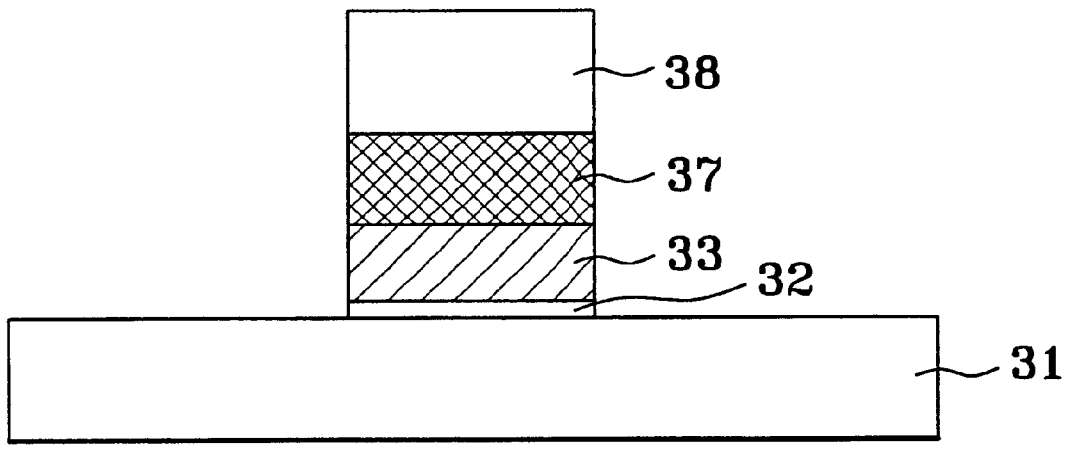

Referring to FIG. 5D, an insulating layer 38 such as an oxide layer or a nitride layer is deposited on the $TiSi_2$ layer 37. Next, the insulating layer 38, the $TiSi_2$ layer 37, the polysilicon layer 33 and the gate oxide layer 32 are etched to form a gate electrode having a stacked structure of polysilicon layer/$TiSi_2$ layer.

Figure 5E:
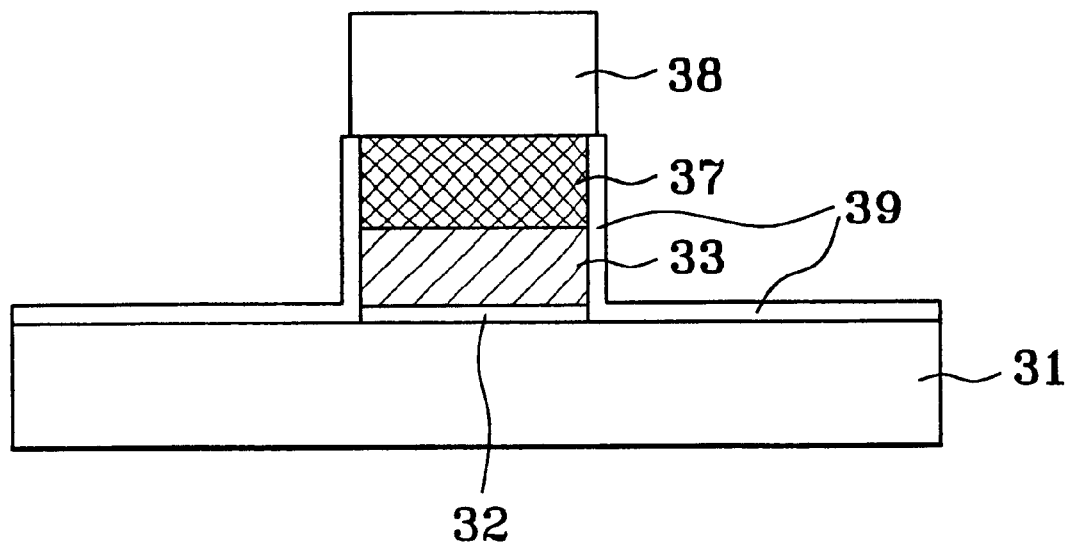

Referring to FIG. 5E, for removing damages and polysilicon residues due to the etching process and recovering the reliability of the gate oxide layer 32, gate re-oxidation process is performed, so that an oxide layer 39 is formed on the surface of the substrate 31 and on the side wall of the gate electrode. Here, the oxide layer 39 is uniformly formed, since the oxidation rate of the $TiSi_2$ layer 37 is equalized to that of the polysilicon layer 34 due to the silicon existing excessively in the $TiSi_2$ layer 37. Preferably, the gate re-oxidation process is performed at the temperature of 700 to 850° C. under dry atmosphere and the oxide layer 39 is formed to the thickness of 20 to 200 Å.

In this embodiment, by using $TiSi_x$ target the mole ratio of Si:Ti of which is 2.0 to 2.2, particle number is minimized. Furthermore, by interposing the silicon layer between the first and second $TiSi_x$ layers, the $TiSi_2$ layer is formed in silicon rich state, so that the oxide layer is uniformly formed on the side walls of the polysilicon layer and the $TiSi_2$ layer during the gate re-oxidation.

According to the present invention, gate re-oxidation process is performed after forming a silicon layer on the side wall of the gate electrode having a stacked structure of a polysilicon layer and a titanium silicide layer. Therefore, only the silicon layer is oxidized during the gate re-oxidation, thereby preventing the excess oxidation of the titanium silicide layer. As a result, the line width of the titanium silicide layer is maintained, thereby improving the conductivity of the gate electrode.

Furthermore, by using $TiSi_x$ target the mole ratio of Si:Ti of which is 2.0 to 2.2 and by interposing a silicon layer between first and second $TiSi_x$ layers, particle number is minimized and an oxide layer is uniformly formed on the side walls of a polysilicon layer and a TiSi$_2$ layer during gate re-oxidation.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of forming a gate electrode in a semiconductor device, comprising the steps of:
    forming a gate oxide layer, a polysilicon layer, a refractory conductive layer and a mask layer on a semiconductor substrate, in sequence;
    depositing a first TiSi$_x$ layer on the polysilicon layer;
    depositing a silicon layer on the first TiSi$_x$ layer;
    etching the mask layer, the refractory conductive layer, the polysilicon layer and the gate oxide layer to form a gate electrode;
    forming a silicon layer on a surface of the substrate and the gate electrode;
    depositing a second TiSi$_x$ layer on the silicon layer;
    anisotropically etching the silicon layer so as to exist on a side wall of the gate electrode; and
    oxidizing a resultant substrate by a re-oxidation process.

2. The method according to claim 1, wherein the refractory conductive layer is formed of a titanium silicide layer.

3. The method according to claim 2, further comprising the step of removing side walls of the titanium silicide layer to a selected width between the step of forming the gate electrode and the step of forming the silicon layer.

4. The method according to claim 3, wherein the step of removing the side walls of the titanium silicide layer is performed by wet etching using dilute HF solution or dilute BOE solution.

5. The method according to claim 3, wherein the side walls of the titanium silicide layer is removed to a thickness of 20 to 100 Å.

6. The method according to claim 2, wherein the titanium silicide layer is formed by physical vapor deposition using a titanium silicide target.

7. The method according to claim 6, wherein a mole ratio of a silicon to a titanium in the titanium silicide target is 2.0 to 2.5.

8. The method according to claim 2, wherein the titanium silicide layer is formed to a thickness of 500 to 1,000 Å.

9. The method according to claim 2, further comprising the step of performing thermal-treating between the step of forming the titanium silicide layer and the step of forming the mask layer.

10. The method according to claim 9, wherein the thermal treating is performed at a temperature of 700 to 900° C. for 10 to 60 seconds.

11. The method according to claim 2, wherein the silicon layer is formed to a thickness of 10 to 100 Å.

12. The method according to claim 1, wherein the gate oxide layer is formed to a thickness of 30 to 100 Å.

13. The method according to claim 1, wherein the silicon layer is formed of an undoped amorphous silicon layer.

14. The method according to claim 1, wherein the step of oxidizing the resultant substrate by the re-oxidation process is performed at the temperature of 700 to 850° C. under dry atmosphere so as to form an oxide layer to a thickness of 20 to 200 Å.

15. The method according to claim 1, wherein the refractory conductive layer is formed of one selected from the group consisting of a tungsten layer, a tantalum layer and a molybdenum layer.

16. The method according to claim 15, wherein the refractory conductive layer is formed to a thickness of 500 to 2000 Å.

17. The method according to claim 15, further comprising the step of forming a diffusion barrier layer between the step of forming the polysilicon layer and the step of forming the refractory conductive layer.

18. The method according to claim 17, wherein the diffusion barrier layer is formed of a tungsten nitride layer or a titanium nitride layer.

19. The method according to claim 18, wherein the diffusion barrier layer is formed to a thickness of 50 to 300 Å.

20. The method according to claim 1, further comprising the step of:
    thermal-treating the resultant substrate to transform the silicon layer of side walls of the polysilicon layer and a mask layer into a thermal oxidation layer; and
    to transform the silicon layer of the side walls of the refractory conductive layer into a silicide layer prior to the step of oxidizing the resultant substrate by the re-oxidation process.

21. The method according to claim 20, further comprising the steps of:
    ion-implanting low concentration impurity ions for source/drain into a surface of the semiconductor substrate using the gate electrode, the thermal oxidation layer of the side walls of the gate electrode and the silicide layer of the side walls of the refractory conductive layer as a mask after the re-oxidation process;
    forming a spacer of an oxide layer on the thermal oxidation layer of the side walls of the gate electrode and on the silicide layer of the side walls of the refractory conductive layer; and
    ion-implanting high concentration impurity ions for source/drain into the surface using the spacer of an oxide layer as a mask.

22. The method according to claim 1, wherein the silicon layer is formed to a thickness of 50 to 200 Å.

23. A method of forming a gate electrode in a semiconductor device, comprising the steps of:
    forming a gate oxide layer and a polysilicon layer on a semiconductor substrate;
    depositing a first TiSi$_x$ layer on the polysilicon layer;
    depositing a silicon layer on the first TiSi$_x$ layer;
    depositing a second TiSi$_x$ layer on the silicon layer;
    thermal-treating a resultant substrate to form a crystalline TiSi$_2$ layer on the polysilicon layer;
    etching an insulating layer, the TiSi$_2$ layer, the polysilicon layer and the gate oxide layer to form a gate electrode having a stacked of TiSi$_2$ layer and the polysilicon layer; and
    performing gate re-oxidation for removing damage and particle due to the etching and recovering reliability of the gate oxide layer.

24. The method according to claim 23, wherein the first and second TiSi$_x$ layers are respectively formed by physical vapor deposition using TiSi$_x$ target a mole ratio of Si:Ti which is 2.0 to 2.2.

25. The method according to claim 23, wherein the first and second TiSi$_x$ layers are formed to a thickness of 300 to 800 Å, respectively.

26. The method according to claim 23, wherein the silicon layer is formed to a thickness of 50 to 300 Å.

27. The method according to claim 23, wherein the silicon layer is formed of one selected from the group consisting of an amorphous silicon layer, a polysilicon layer, and undoped silicon layer and a doped silicon layer.

28. The method according to claim 23, wherein the thermal-treating is performed by furnace process or rapid thermal process.

29. The method according to claim 28, wherein the furnace process is performed at the temperature of 700 to 900° C. for 5 to 30 minutes.

30. The method according to claim 28, wherein the rapid thermal process is performed at the temperature of 700 to 1,000° C. for 10 to 60 seconds.

31. The method according to claim 23, wherein the gate re-oxidation process is performed at the temperature of 700 to 850° C. under dry atmosphere.

32. The method according to claim 23, wherein the gate re-oxidation process is performed so as to form an oxide layer having the thickness of 20 to 100 Å.

* * * * *